United States Patent
Jang

(10) Patent No.: US 12,325,103 B2
(45) Date of Patent: Jun. 10, 2025

(54) CARRIER RECYCLING PROCESS

(71) Applicant: SK SILTRON CO., LTD., Gumi-si (KR)

(72) Inventor: Soo Cheon Jang, Gyeongsangbuk-do (KR)

(73) Assignee: SK SILTRON CO., LTD., Gyeongsangbuk-do (KR)

( * ) Notice: Subject to any disclaimer, the term of this patent is extended or adjusted under 35 U.S.C. 154(b) by 0 days.

(21) Appl. No.: 18/230,772

(22) Filed: Aug. 7, 2023

(65) Prior Publication Data

US 2024/0227121 A1  Jul. 11, 2024

(30) Foreign Application Priority Data

Jan. 5, 2023  (KR) .................. 10-2023-0001626

(51) Int. Cl.
| | | |
|---|---|---|
| C23C 16/24 | (2006.01) | |
| B24B 37/27 | (2012.01) | |
| C23C 16/27 | (2006.01) | |
| C23C 18/12 | (2006.01) | |

(52) U.S. Cl.
CPC .............. B24B 37/27 (2013.01); C23C 16/24 (2013.01); C23C 16/27 (2013.01); C23C 18/1241 (2013.01)

(58) Field of Classification Search
CPC ...... C23C 16/24; C23C 16/27; C23C 18/1241
See application file for complete search history.

(56) References Cited

U.S. PATENT DOCUMENTS

2008/0233840 A1*  9/2008  Pietsch .................. B24B 37/08
451/41

FOREIGN PATENT DOCUMENTS

| JP | 2010-030014 | 2/2010 |
|---|---|---|
| KR | 10-2015-0111930 | 10/2015 |
| KR | 10-2020-0135175 | 12/2020 |
| KR | 10-2022-0032035 | 3/2022 |

OTHER PUBLICATIONS

Korean Office Action dated May 14, 2024 issued in Application No. 10-2023-0001626.

* cited by examiner

Primary Examiner — Kelly M Gambetta
(74) Attorney, Agent, or Firm — KED & ASSOCIATES

(57) ABSTRACT

A carrier recycling process designed to recycle carriers discarded after use for a certain period of time. The carrier recycling process includes dipping a carrier to be discarded in an organic solvent to remove a bond and to separate a body and an insert from each other, securing a surface roughness of one side surface of the body from which the insert has been separated, depositing a diamond-like-carbon (DLC) coating layer on the one side surface of the body having the secured surface roughness using a PECVD process, and coupling the insert to a circumference of the body having the DLC coating layer deposited thereon.

3 Claims, 2 Drawing Sheets

FIG. 3(d')

CARRIER RECYCLING PROCESS

CROSS REFERENCE TO RELATED APPLICATION

This application claims priority under 35 U.S.C. § 119 to Korean Patent Application No. 10-2023-0001626, filed in Korea on 5 Jan. 2023, which is hereby incorporated in its entirety by references as if fully set forth herein.

TECHNICAL FIELD

Embodiments relate to a carrier recycling process, and more particularly to a carrier recycling process designed to recycle carriers discarded after use for a certain period of time.

BACKGROUND

In general, a carrier, which is used as an auxiliary material in a double side polishing (DSP) process, serves as a guide for smooth polishing when a wafer to be processed is pressed vertically and force is applied thereto in a horizontal direction.

The carrier is made of titanium and is processed so as to have a shape and thickness suitable for the DSP process.

In particular, the thickness of the carrier directly affects the final thickness and flatness quality of the wafer to be processed. When the shape of the wafer is convex, a thicker carrier is used than before. When the shape of the wafer is concave, a thinner carrier is used than before. The thickness of the carrier is selectively used in response to the changing shape of other auxiliary materials, such as a pad and a slurry, used in the DSP process based on lifetime thereof, whereby it is possible to secure final flatness quality.

FIG. 1 is a view conceptually showing the shape of a general carrier depending on a use state thereof, wherein FIG. 1(a) shows the structure of a carrier having an insert coupled to the outer circumference of a body by bonding, and FIG. 1(b) shows the form of a carrier to be discarded based on the lifespan thereof after use for a certain period of time in the state of FIG. 1(a).

During the DSP process, the carrier is subjected to some pressure along with a workpiece, and is continuously worn due to interaction with the pad and slurry. Over time, the carrier becomes thinner due to the wear of the body 1 and the insert 2, and when the thickness of the carrier reaches a certain level, it is difficult to secure flatness quality of the wafer, and therefore the wafer is discarded.

SUMMARY

Embodiments provide a carrier recycling process configured to recycle carriers to be discarded as described above and a carrier manufactured based thereon.

Objects of embodiments are not limited to the aforementioned objects, and other unmentioned objects will be clearly understood by those skilled in the art based on the following description.

In one embodiment, a carrier recycling process, which recycles a carrier including a body and an insert coupled to the circumference of the body by bonding, includes an insert separation step of dipping the carrier to be discarded in an organic solvent to remove a bond and to separate the body and the insert from each other, a surface roughness securing step of securing the surface roughness of one side surface of the body from which the insert has been separated, a thickness restoration step of depositing a diamond-like-carbon (DLC) coating layer on the one side surface of the body having the secured surface roughness using a PECVD process, and an insert coupling step of coupling the insert to the circumference of the body having the DLC coating layer deposited thereon.

The organic solvent may be made of toluene.

The organic solvent may have a temperature of 40° C. or higher.

The carrier may be dipped in the organic solvent for at least 2 hours.

In the insert coupling step, a mixture of aramid and epoxy may be injected in a liquid state so as to be injection-molded.

The mixture of aramid and epoxy may be manufactured by mixing 15% of aramid and 85% of epoxy with each other.

Silicon may be deposited between the body and the DLC coating layer.

In another embodiment, a carrier is manufactured through the carrier recycling process.

The modes of the present disclosure are merely some of preferred embodiments, and various embodiments having technical features of the present disclosure reflected therein may be derived and understood by a person having ordinary skill in the art based on the following detailed description of specific embodiments.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1A:
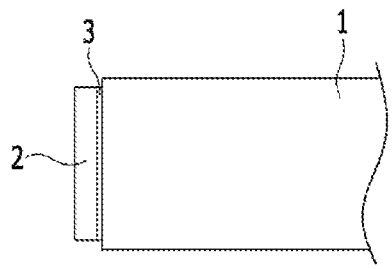
FIGS. 1(a) and 1(b) are views conceptually showing the shape of a general carrier depending on a use state thereof.

Reference will now be made in detail to embodiments, examples of which are illustrated in the accompanying drawings.

In the drawings, the size of each element is exaggerated, omitted, or schematically shown for convenience of description and clarity. In addition, the size of each element does not entirely reflect the actual size thereof. In the drawings, the same reference numerals denote the same elements.

Figure 1B:
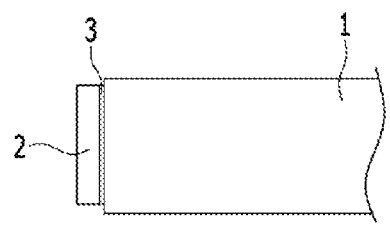
Figure 2:
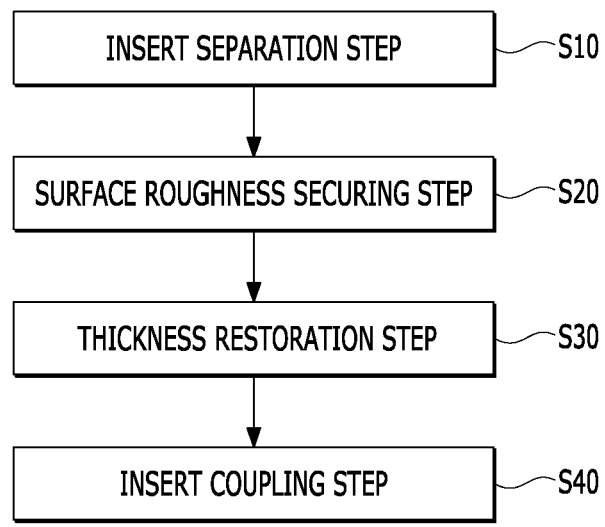
FIG. 2 is a view showing a carrier recycling process according to an embodiment.

FIG. 2 is a view showing a carrier recycling process according to an embodiment, and FIG. 3 is a conceptual view of a carrier manufactured through the carrier recycling process according to the embodiment. The carrier recycling process according to the embodiment will be described with reference to FIGS. 1, 2, and 3.

First, a general carrier may include a body 10 made of titanium and an insert 20 coupled to the circumference of the body 10 by bonding, the insert 20 being made of aramid.

The carrier recycling process according to the embodiment is configured as described above to regenerate and reuse a carrier to be discarded after use, and may include an insert separation step (S10), a surface roughness securing step (S20), a thickness restoration step (S30), and an insert coupling step (S40). In addition, each step may be performed by a known automated machine, and a detailed description of the automated machine will be omitted hereinafter since it is considered to obscure the gist of the embodiment.

Figure 3A:
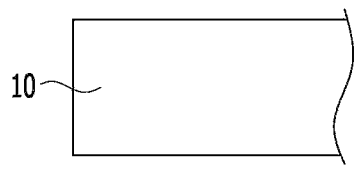
FIGS. 3(a) to 3(d) is a conceptual view of a carrier manufactured through the carrier recycling process according to the embodiment.
Figure 3B:
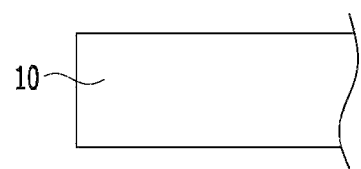

In the insert separation step (S10), a carrier to be discarded is dipped in an organic solvent at a temperature of 40° C. or higher for at least 2 hours. The bond 3 between the body 1 and the insert 2 may be removed by dipping in the organic solvent. The organic solvent may be made of toluene. Meanwhile, even when the temperature of the organic solvent is lower than 40° C., it is possible to remove the bond 3; however, the removal time of the bond 3 may be long, whereby the time loss may increase. Therefore, the removal time of the bond 3 may be about 2 hours only when the temperature of the organic solvent is at least 40° C., and the removal time of the bond 3 does not significantly change even when the temperature of the organic solvent is 40° ° C. or higher. In addition, at a dipping time of less than 2 hours, the bond 3 is not properly removed, and therefore more separation pressure (force) is required to separate the body 1 and the insert 2 from each other. As a result, there is a risk that the body 1 may be damaged, especially a tooth portion (not shown) formed on the circumference of the body 1 may be damaged. Therefore, it is preferable to dip the carrier to be discarded ((b) in FIG. 1) for at least 2 hours in the state in which the temperature of the organic solvent is at least 40° C. Since the bond 3 between the body 1 and the insert 2 is dissolved in the organic solvent through dipping, it is possible to separate the body 1 and the insert 2 from each other even with a predetermined force (pressure) at which the body (1) is not damaged. After separation between the body 1 and the insert 2, the bond 3 remaining on the circumference of the body 1, i.e. the tooth portion, may be cleanly removed with a cleaning brush or the like. FIG. 3(a) shows the body 10 with the insert separated and the bond removed.

The body 10 from which the insert and the bond have been removed may be subjected to a cleaning and drying process, and then the surface roughness securing step (S20) may be performed.

The surface roughness securing step (S20) is a step of securing the surface roughness of one side surface of the body 10 from which the insert has been separated. That is, by securing the flatness of one side surface of the body 10, it is possible to determine the flatness of the surface of a coating layer to be deposited at the time of subsequent deposition of a DLC coating layer 30. When diamond-like-carbon (DLC) coating is performed without securing the surface roughness in advance, a processing load is generated due to a low coefficient of friction of the DLC material, but this problem may be solved by depositing the DLC coating layer 30 after securing the surface roughness of the body 10 in advance. That is, the surface roughness of the subsequent DLC coating layer 30 may be selectively secured by setting the surface roughness in the surface roughness securing step (S20). The surface roughness securing step (S20) may be performed by polishing, and FIG. 3(b) conceptually shows the body 10 having surface roughness secured by polishing.

The thickness restoration step (S30) is a step of depositing a diamond-like-carbon (DLC) coating layer 30 on one side surface of the body 10 having the secured surface roughness using a PECVD process.

Figure 3C:
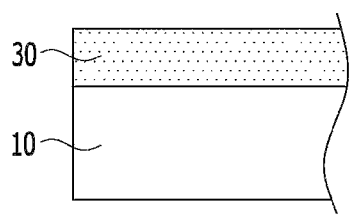

Technology for depositing the DLC coating layer using the PECVD process is known, and therefore a detailed description thereof will be omitted. Uniform and selective thickness formation is possible through the PECVD process. That is, the thickness of the worn carrier may be restored through the DLC coating layer 30, and the DLC coating layer 30 may be deposited so as to have a desired thickness. FIG. 3(c) conceptually shows the body 10 on which the DLC coating layer 30 is deposited so as to have a set thickness.

Figure 3D:
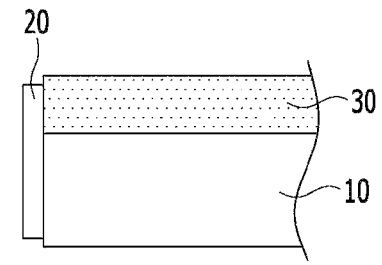
Figure 3D:
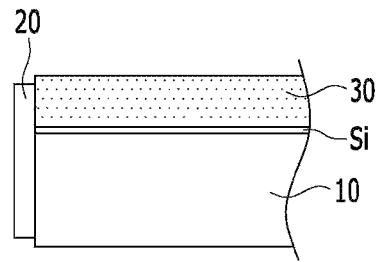

Meanwhile, in the thickness restoration step (S30), silicon (Si) may be further deposited between the body 10 and the DLC coating surface abutting the same in order to additionally secure adhesion force, and this is conceptually shown in FIG. 3(d). When silicon (Si) is deposited, interlayer delamination between the body 10 made of titanium and the DLC coating layer 30 may be prevented.

Finally, the insert coupling step (S40) is a step of coupling the insert 20 to the circumference of the body 10 having the DLC coating layer 30 deposited thereon. The circumference of the body 10 is formed in the shape of teeth, specifically sawteeth, and therefore the insert 20 corresponding to such a shape must be coupled to the circumference of the body 10, as shown in FIG. 3(d). The insert 20 is basically made of aramid alone. In the carrier recycling process according to the embodiment, however, aramid and epoxy may be mixed with each other in a liquid state, and the liquid-state aramid and epoxy mixture may be injected and injection-molded to manufacture the insert 20 as shown in FIG. 3(d).

Aramid is unsuitable for injection molding (high reject rate) due to high viscosity and low expansion rate thereof. For this reason, a mixture of aramid and epoxy may be used, whereby injection molding of the insert 20 through injection in a liquid state is possible.

To this end, it is preferable to mix 15% of aramid and 85% of epoxy with each other at the time of manufacturing the aramid-epoxy mixture. Aramid is resistant to swelling due to moisture. If the proportion of aramid in the mixture is less than 15%, therefore, the properties of aramid (swelling resistance) may deteriorate. If the proportion of aramid in the mixture is more than 15%, viscosity may increase, which is unsuitable for injection molding.

When aramid and epoxy are mixed with each other in an appropriate ratio, i.e. 15% of aramid and 85% of epoxy are mixed with each other, therefore, the mixture may be prepared in a liquid state suitable for injection molding. Furthermore, the insert may be attached to the body 10 without a separate bond as conventionally used due to the properties of epoxy.

Meanwhile, a carrier manufactured through the carrier recycling process may be provided, whereby raw materials may be saved.

As is apparent from the above description, a carrier recycling process according to an embodiment has the following effects.

First, it is possible to recycle a carrier without damage to a body, particularly a tooth portion formed on the circumference of the body, through an insert removal step of removing a bond by dipping in an organic solvent.

At this time, the temperature of the organic solvent is set to 40° C. or higher and the dipping time is set to at least 2 hours, whereby it is possible to efficiently remove the bond between the body and the insert while reducing time loss.

In addition, a processing load is generated in a DLC coating layer due to properties of the material thereof when surface roughness thereof is secured, but this problem may be solved by depositing the DLC coating layer after securing the surface roughness of the body.

In addition, aramid, which has high viscosity and low expansion rate, may be mixed with epoxy, whereby it is possible to injection-mold the insert through liquid injection.

In addition, silicon may be deposited between the body and the DLC coating layer, whereby it is possible to further secure adhesion force between the body and the DLC coating layer.

Meanwhile, a carrier manufactured through the process may be provided, whereby it is possible to reduce raw material costs associated with carrier disposal compared to a conventional method.

It should be noted that the effects of embodiments are not limited to the effects mentioned above, and other unmentioned effects will be clearly understood by those skilled in the art from the above description.

The features, structures, and effects described in the above embodiments are included in at least one embodiment, but are not limited to only one embodiment. Furthermore, features, structures, and effects illustrated in each embodiment may be combined or modified in other embodiments by those skilled in the art to which the embodiments pertain. Therefore, it is to be understood that such combinations and modifications fall within the scope of the present disclosure.

What is claimed is:

1. A carrier recycling process for recycling a carrier, the carrier comprising a body and an insert coupled to a circumference of the body by bonding, the carrier recycling process comprising:

dipping the carrier to be discarded in an organic solvent to remove a bond and to separate the body and the insert from each other;

securing a surface roughness of one side surface of the body from which the insert has been separated;

depositing a diamond-like-carbon (DLC) coating layer on the one side surface of the body having the secured surface roughness using a-PECVD plasma-enhanced chemical vapor deposition (PECVD) process; and coupling the insert to the circumference of the body having the DLC coating layer deposited thereon, wherein the organic solvent has a temperature of 40° C. or higher, wherein the carrier is dipped in the organic solvent for at least 2 hours, wherein, in the coupling of the insert to the circumference of the body, a mixture of aramid and epoxy is injected in a liquid state so as to be injection-molded, and wherein the mixture of aramid and epoxy is manufactured by mixing 15% of aramid and 85% of epoxy with each other.

2. The carrier recycling process according to claim 1, wherein the organic solvent is made of toluene.

3. The carrier recycling process according to claim 1, wherein silicon is deposited between the body and the DLC coating layer.

* * * * *